United States Patent [19]

Wood

[11] 4,272,562
[45] Jun. 9, 1981

[54] METHOD OF FABRICATING AMORPHOUS MEMORY DEVICES OF REDUCED FIRST FIRE THRESHOLD VOLTAGE

[75] Inventor: Grady M. Wood, Melbourne, Fla.

[73] Assignee: Harris Corporation, Melbourne, Fla.

[21] Appl. No.: 50,033

[22] Filed: Jun. 19, 1979

[51] Int. Cl.³ .............................................. H01L 45/00
[52] U.S. Cl. .......................................... 427/87; 357/2; 427/126.2; 427/374.1; 204/192 S
[58] Field of Search .................. 357/2; 427/87, 126.2, 427/374.1; 204/192 S

[56] References Cited

U.S. PATENT DOCUMENTS

| | | | |
|---|---|---|---|
| 3,918,032 | 11/1975 | Nicolaides | 357/2 |
| 3,920,461 | 11/1975 | Asahara et al. | 357/2 |
| 3,983,542 | 9/1976 | Ovshinsky | 357/2 |
| 4,115,872 | 9/1978 | Bluhm | 357/2 |
| 4,177,475 | 12/1979 | Holmberg | 357/2 |
| 4,180,866 | 12/1979 | Shanks | 357/2 |
| 4,181,913 | 1/1980 | Thornburg | 357/2 |

Primary Examiner—John D. Smith
Attorney, Agent, or Firm—Leitner, Palan, Martin & Bernstein

[57] ABSTRACT

The first fire voltage of amorphous memory devices are reduced by forming the storage element of two layers, the first being in the crystalline state and the second being the amorphous state. The process deposits a first layer of switchable material and raises the temperature to crystallize the first layer. The wafer is then cooled and the remainder of the switchable material to form the storage element is deposited in an amorphous state.

8 Claims, 10 Drawing Figures

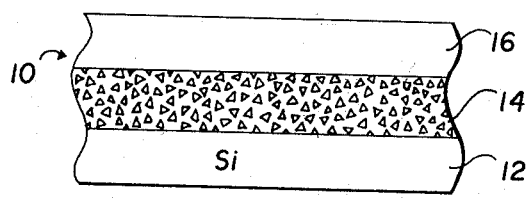
FIG. 1
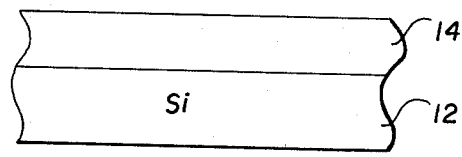
FIG. 2
FIG. 3
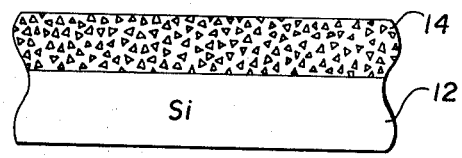
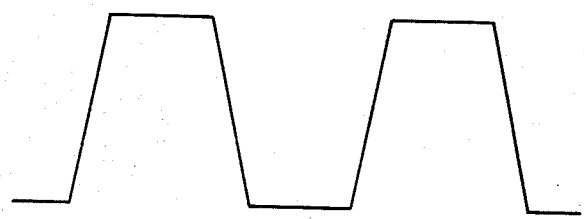
FIG. 4A
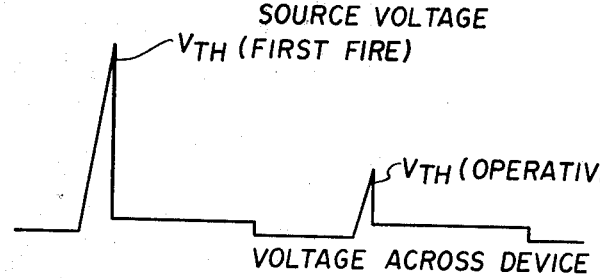
FIG. 4B
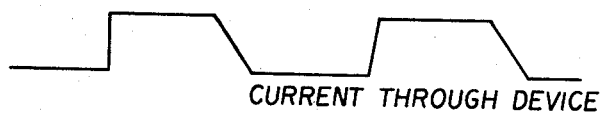
FIG. 4C

FIRST ERASE PULSE

SECOND ERASE PULSE $N_{TH}$ ERASE PULSE

FINAL ERASE PULSE

METHOD OF FABRICATING AMORPHOUS MEMORY DEVICES OF REDUCED FIRST FIRE THRESHOLD VOLTAGE

BACKGROUND OF INVENTION

The present invention relates generally to amorphous memory devices and more specifically to a method producing amorphous memory device with a substantially low first fire threshold voltage.

Amorphous memory devices, for example, a tellurium based chalcogenide glass are well known. Deposition conditions can be adjusted such that the materials can initially be deposited either in a crystalline state or an amorphous state. Although not incompatible, the deposition of these films has been difficult to integrate with normal silicon process techniques. Similarly, the resulting device requires support circuitry of a higher capability than that of the normal silicon circuits.

To deposit an amorphous film in a crystalline state, the deposition is performed at or above the crystallization temperature resulting in a crystallized film with a conductivity of 10 to 100 (ohm-centimeter)$^{-1}$ for a typical chalcogenide material. In order to erase these devices from a low resistance crystallize state to a higher resistance amorphous state, high current densities are required, generally in the range of $5 \times 10^5$ to $1 \times 10^6$ amperes per square centimeters. Although not impossible, the standard silicon circuitry does not generally provide such high current density capacities, (thus requiring the design of special capacity circuit elements).

When the amorphous film is deposited in the amorphous state, the first fire threshold voltage is typically 2 to 5 times the normal operating threshold voltage. Thus the silicon support circuitry must be capable of supplying the higher voltage levels necessary for the first firing.

In order to reduce the current density and high voltage requirements of amorphous memory devices as first formed, the prior art has attempted to form the memory devices in a condition between completely crystallized state and a completely amorphous state. One approach to depositing partially crystallized material involves adjusting the deposition rate of the material to produce substrate temperatures near the crystallization temperature of the material. Since these films, which are not oxygen contaminated by leaky vacuum systems and other causes, have a sharp crystallization temperature, this approach requires very critical substrate temperature control within the vacuum deposition system. In a production environment, this degree of control is difficult to achieve and economically infeasible.

Another technique of the prior art to lower the first firing threshold voltage of the device is to fire the device at an elevated temperature. Since the first fire threshold voltage decreases only typically 0.03 percent to 0.06 percent per degree centigrade depending upon the material, a sufficient reduction in threshold voltage cannot be achieved in a reasonable operating temperature range.

Although the prior art has attempted to lower the first fire threshold voltage, they have not been able to do so in a repeatable manner.

SUMMARY OF THE INVENTION

An object of the present invention is to provide a method of fabricating an amorphous memory device which provides a first fire threshold voltage compatible with the capacity of the majority of silicon circuitry.

Another object of the present invention is to provide a method of fabricating a reduced first fire threshold voltage amorphous device which is repeatable in a production environment.

Still another object of the present invention is to provide a reduced first fire threshold voltage amorphous memory device which may be economically produced in the production environment.

An even further object of the present invention is to provide a method of producing an amorphous memory device having a first fire threshold voltage reduction in the range of 10 to 90 percent.

A still even further object is to substantially reduce the first fire voltage of an amorphous memory device without affecting the operating threshold voltage.

These and other objects of the present invention are obtained by forming the amorphous memory element, layer or film in two layers, namely a crystallized layer and an amorphous layer. Since the first fire threshold voltage is a function of the switching material thickness, the reduction of the first fire threshold voltage will be equal to the thickness of the crystallized layer divided by the total of the two layer thicknesses. The process begins by depositing a first layer of switchable material on a substrate and raising the temperature sufficient to crystallize the first layer. The substrate and first layer are then cooled and a second layer of the same switchable material is applied in the amorphous state to complete the desired thickness of the memory film.

BREIF DESCRIPTION OF THE DRAWINGS

FIG. 1 is a cross-sectional view of an amorphous memory device fabricated according to the principles of the present invention.

FIGS. 2 and 3 are cross-sectional views at different stages of fabrication according to the principles of the present invention.

Figure 5A:
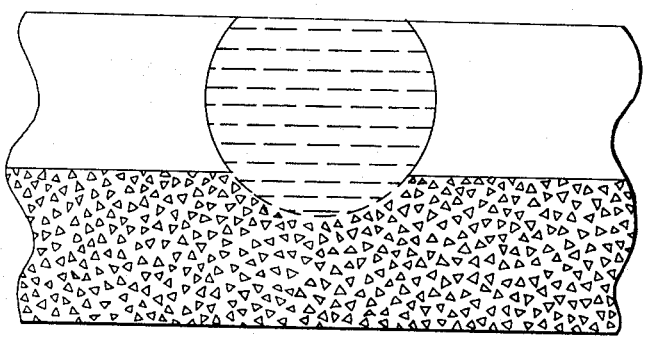

FIGS. 4 A, B and C are graphs of voltage of a voltage source, the resulting voltage across a memory device of FIG. 1 and the resulting current through said memory device, respectively.

FIGS. 5 A through 5 D are cross-sectional views of the amorphous memory device at different stages of an erase sequence.

DESCRIPTION OF THE PREFERRED EMBODIMENT

An amorphous memory device 10, as illustrated in FIG. 1, is formed on, for example, a silicon substrate 12 and has a first layer 14 in a crystallized state and a second layer 16 in an amorphous state. The device illustrated in FIG. 1 is a cross-sectional representation without electrodes or other types of structure. For example the silicon substrate 12 may include a doped region to act as an active electrode, or layer 14 may be separated from the substrate 12 by various metallic conductors depending upon the structure desired. Similarly a top electrode may be applied to layer 16 and include a plurality of electrode layers. Since the electrode structure does not form part of the present invention, it has not been illustrated or described in detail. Although the design of the present invention was to provide an amorphous memory device having a first fire threshold voltage compatible with the majority of silicon formed circuitry, other substrates may be used in the fabrication process of the present invention.

For given material programmable between an amorphous and crystalline state, the first fire threshold voltage is a function of the thickness of the switchable material. Thus for a memory element 10 having a thickness which is the sum of layers 14 and 16, the percentage or reduction of the first fire threshold voltage will be equal to the thickness of the crystalline layer 14 divided by the total thicknesses or the sum of the thickness of layers of 14 and 16. Thus by varying the thickness of layer 14 between 10 to 90 percent of the total thickness of layers 14 and 16, the first fire threshold voltage may be reduced to 10 to 90 percent of the first fire threshold voltage of a memory device in the amorphous state having a total thickness of layers 14 and 16.

The formation of the amorphous memory device 10 begins as illustrated in FIG. 2 by depositing the switchable material onto the substrate 12 to form a layer 14 of a desired first layer thickness. After the deposition of the first layer 14, the substrate 12 and consequently the first layer 14 are heated to a temperature for a sufficient period of time to completely crystallize the material of layer 14. The resulting structure is illustrated in FIG. 3.

By way of example, layer 14 may be formed from a tellurium based chalcogenide glass deposited by sputtering or evaporation techniques at temperatures in the range of 25 degrees centigrade to 100 degrees centigrade. For a tellurium based chalcogenide glass of appproximately 3500 angstroms in thickness, the substrate is heated to a temperature of 225 degrees centigrade, for example, 15 minutes to completely crystallize the layer 14.

Following the cyrstallization of layer 14, the substrate is cooled sufficiently to allow depositing of the same material to form the layer 16 in the amorphous state. Layer 16 is deposited to the remainder of the total thickness desired to define the specific first fire threshold voltage. For the tellurium based chalcogenide glass of the previous paragraph, the substrate must be cooled below a temperature of less than 100 degrees centigrade. The device or resulting structures is illustrated in FIG. 1.

For an amorphous memory device 10 as illustrated in FIG. 1, the crystalline layer of the memory element 14 may have a thickness of approximately 3500 angstroms and the amorphous state layer 16 may have a thickness of approximately 3500 angstroms producing a total thickness of the memory element of 7000 angstroms. Typically for a tellurium based chalcogenide glass having a thickness of 7000 angstroms formed in a totally amorphous state, the first fire threshold voltage is typically 30 volts. By forming the memory element of layers 14 and 16, having the thicknesses just described, the first fire voltage is reduced by 50 percent to approximately 15 volts.

Since the first fire threshold voltage is a function of separate and distinct process steps whose temperatures are readily controllable, the forming of the amorphous memory devices of a desired threshold may be repeatably produced. It is critical that the layer 14 be deposited and then heated to be completely crystallized to be followed by cooling of the layer 14 and the substrate 12 such that the subsequent formation or depositing of layer 16 assures that it is in almost a completely amorphous state 16. This specific sequence and separation of the steps make the present system compatible with and completely achievable in the production environment.

The operation of the amorphous memory device of FIG. 1 is illustrated in the graphs of FIGS. 4A, B and C. A voltage source and a current limiting resistor in series with the amorphous device provide a voltage illustrated in FIG. 4A. For the first fire or the first pulse applied to a virgin or as manufactured or as formed amorphous memory device, the voltage across the device increases until the first fire theshold of the amorphous device is reached. Upon exceeding the threshold of the device, it switches from a high to a low resistance state for the remainder of the voltage source applied voltage pulse. This is illustrated in FIG. 4B. The current through device is illustrated in FIG. 4C wherein the current is substantially zero until the amorphous memory device fires and switches to the low resistance state. For second and subsequent application of pulses from the voltage source across the amorphous device, the threshold of the device is at an operating level which is lower than the first fire threshold voltage. This is illustrated in FIG. 4B. The operation of amorphous memory devices are well-known and thus will not be described here in detail. Although the first fire threshold voltage is substantially reduced, the generating threshold voltage is unchanged for an equivalent device.

Figure 5B:
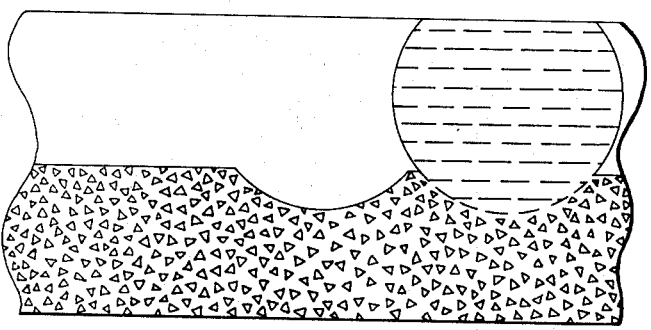

An erase sequence for the amorphous memory structure 10 of FIG. 1 is illustrated in FIGS. 5A through 5D. For the first erase pulse having a voltage amplitude of appoximately 20 volts for the structure having the thicknesses described for FIG. 1, a hot channel is formed through layer 16 to layer 14 and is rapidly quenched to convert a portion of the crystallized layer 14 into an amorphous state. This creates a crater 18 in the surface of crystalline layer 14 as illustrated in FIGS. 5A and 5B. The second erase pulse having the same power as the previous erase pulse forms a hot filament in the amorphous layer 16 to the nearest surface portion of layer 14. This creates a crater 20 equivalent to the crater 18 in the surface of crystalline layer 14 converting it to the amorphous state. By the subsequent application of a plurality of pulses, the surface or the thickness of the crystalline layer 14 is converted to amorphous material.

Figure 5C:
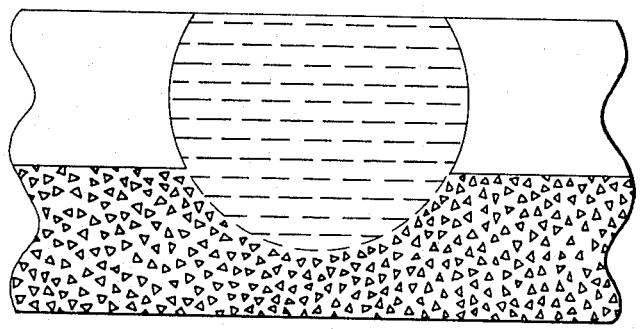
Figure 5D:
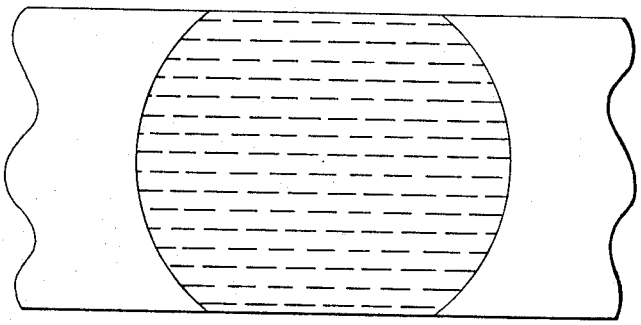

Typically the conversion of the crystalline layer results in substantially planar phenomenon as illustrated in FIG. 5C for the nth erase pulse. The final erase pulse is illustrated in FIG. 5D wherein a hot channel forms across the total thickness of layers 14 and 16 and which when quenched will result in a memory element being in completely the amorphous state.

The use of the amorphous memory device of the present invention illustrated in FIG. 1 may be used to define a plurality of logic states in addition to merely lowering the first fire threshold voltage of the amorphous memory device. Layer 14 may be formed to be for example, 70 percent of the total of layers 14 and 16 to define a first logic state. By using the erase sequence illustrated in FIG. 5, the thickness of layer 14 may be reduced in a substantially planar manner to a level of, for example, 25 percent of the total thickness of layers 14 and 16 as illustrated in FIG. 5C. This would form what could be considered a second of three logic states wherein the third logic state is the amorphous state. Using this concept, and technique the structure of FIG. 1 may be used to provide a plurality of logic states usable for example in a PROM environment.

It is evident from the description of the present invention that the objects of the present invention are obtained in that a method of fabrication is provided to reduce the first fire threshold voltage of an amorphous memory device which can be repeatedly produced and economically achievable in a production environment. Although the invention has been described and illustrated in detail, it is clearly understood that the same is by way of illustration and example only, and is not to be taken by way of limitation. The scope of the present invention is to be limited only by the terms of the appended claims.

What is claimed is:

1. A method of forming an amorphous memory device with reduced first fire threshold voltage comprising:

depositing a first layer of material in an amorphous state capable of switching from a high resistance state to a low resistance state when a voltage above its threshold voltage level is applied;

heating the first layer sufficiently to crystallize said first layer; and depositing a second layer of the same material as said first layer in an amorphous state;

said first and second layers constituting the storage media of homogeneous material.

2. The method according to claim 1 wherein said first layer is formed to have a thickness of 10 to 90 percent of the total thickness of the first and second layers.

3. The method according to claim 1 wherein said material is a tellurium based chalcogenide glass and the layers are formed on a silicon substrate.

4. The method according to claim 1 wherein the first and second layers are formed of appropriate thicknesses to produce a first fire threshold voltage of approximately ten volts or less.

5. The method according to claim 1 wherein the first layer is cooled before the second layer is deposited.

6. A method for controlling the first fire threshold voltage of an amorphous memory device comprising:

depositing on a substrate a first layer of material in an amorphous state capable of switching from a high resistance state to a low resistance state when a voltage above its threshold voltage level is applied;

heating the substrate at or above the crystallization temperature of the first layer for a sufficient period to crystallize the first layer;

cooling the substrate below said crystallization temperature; and depositing a second layer of the same material as the first layer in an amorphous state;

said first and second layers constituting the storage media of homogeneous material;

the first and second layers being deposited to first and second thicknesses respectively to define a preselected first fire threshold voltage.

7. The method according to claim 6 wherein said material is a tellurium based chalcogenide glass and the layers are formed on a silicon substrate.

8. The method according to claim 6 wherein the first and second layers are formed of appropriate thicknesses to produce a first fire threshold voltage of approximately ten volts or less.

* * * * *